United States Patent
Chen et al.

(10) Patent No.: US 10,707,130 B2
(45) Date of Patent: Jul. 7, 2020

(54) SYSTEMS AND METHODS FOR DICING SAMPLES USING A BESSEL BEAM MATRIX

(71) Applicant: The Chinese University of Hong Kong, Hong Kong (CN)

(72) Inventors: Shih-Chi Chen, Hong Kong (CN); Hiu Hung Lee, Hong Kong (CN); Dapeng Zhang, Hong Kong (CN); Erxuan Zhao, Hong Kong (CN); Yina Chang, Hong Kong (CN); Dihan Chen, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 0 days.

(21) Appl. No.: 15/911,389

(22) Filed: Mar. 5, 2018

(65) Prior Publication Data
US 2019/0273025 A1 Sep. 5, 2019

(51) Int. Cl.
| | |
|---|---|
| B23K 26/06 | (2014.01) |
| B23K 26/03 | (2006.01) |
| B23K 26/067 | (2006.01) |
| B23K 26/38 | (2014.01) |
| B23K 26/0622 | (2014.01) |
| B23K 26/04 | (2014.01) |

(Continued)

(52) U.S. Cl.
CPC .............. *H01L 21/78* (2013.01); *B23K 26/03* (2013.01); *B23K 26/032* (2013.01); *B23K 26/048* (2013.01); *B23K 26/0622* (2015.10); *B23K 26/0624* (2015.10); *B23K 26/0626* (2013.01); *B23K 26/0652* (2013.01); *B23K 26/0661* (2013.01); *B23K 26/0665* (2013.01); *B23K 26/0673* (2013.01); *B23K 26/0676* (2013.01); *B23K 26/08* (2013.01); *B23K 26/1476* (2013.01); *B23K 26/38* (2013.01); *H01L 21/268* (2013.01); *H01L 21/67092* (2013.01)

(58) Field of Classification Search
CPC ... H01L 21/67092; H01L 21/26; H01L 21/78; H01L 21/268; B23K 26/0622; B23K 26/38; B23K 26/0673; B23K 26/0661; B23K 26/0626; B23K 26/032; B23K 26/0665

See application file for complete search history.

(56) References Cited

U.S. PATENT DOCUMENTS

| | | | |
|---|---|---|---|
| 6,016,223 A | 1/2000 | Suzuki et al. | |
| 6,633,433 B2 | 10/2003 | Bergstein et al. | |

(Continued)

OTHER PUBLICATIONS

Bowman et. al., "Efficient generation of Bessel beam arrays by means of an SLM", Eur. Phys. J Special Topics 199, 159-166 (2011) (Year: 2011).*

*Primary Examiner* — Bilkis Jahan
*Assistant Examiner* — Victor V Barzykin
(74) *Attorney, Agent, or Firm* — Schwegman Lundberg & Woessner, P.A.

(57) ABSTRACT

Systems and methods for dicing a sample by a Bessel beam matrix are disclosed. The method for dicing a sample by a Bessel beam matrix may comprise generating a Bessel beam matrix including multiple Bessel beams arranged in a matrix form, according to a predetermined dicing layout of the sample; controlling a focus position of each Bessel beam in the generated Bessel beam matrix; and focusing simultaneously the Bessel beams of the Bessel beam matrix at the respective controlled focus positions within the sample for dicing.

11 Claims, 13 Drawing Sheets

(51) Int. Cl.
   *B23K 26/14*     (2014.01)
   *B23K 26/08*     (2014.01)
   *H01L 21/78*     (2006.01)
   *H01L 21/268*    (2006.01)
   *H01L 21/67*     (2006.01)

(56) References Cited

U.S. PATENT DOCUMENTS

| | | |
|---|---|---|
| 8,809,120 B2 | 8/2014 | Miccoli et al. |
| 8,809,166 B2 | 8/2014 | Buenning et al. |
| 9,245,803 B1 | 1/2016 | Park et al. |
| 2012/0267351 A1 | 10/2012 | Huang |
| 2014/0057412 A1 | 2/2014 | Mackh et al. |
| 2014/0198200 A1 | 7/2014 | Betzig |
| 2016/0045979 A1 | 2/2016 | Kawaguchi et al. |
| 2016/0052083 A1 | 2/2016 | Kawaguchi et al. |
| 2016/0052084 A1 | 2/2016 | Kawaguchi et al. |
| 2016/0121426 A1* | 5/2016 | Hollinger ............ B23K 26/0676 425/174.4 |
| 2016/0159679 A1* | 6/2016 | West ..................... B23K 26/38 65/112 |

* cited by examiner

SYSTEMS AND METHODS FOR DICING SAMPLES USING A BESSEL BEAM MATRIX

TECHNICAL FIELD

The present disclosure generally relates to the field of laser processing, more particularly, to systems and methods for dicing a sample by a Bessel beam matrix.

BACKGROUND

Gaussian beams are by far the most common beam used for performing laser dicing. This is mainly attributed to a fact that a Fourier transform of the Gaussian beam remains a Gaussian beam and preserves its intensity profile when passing through complex lens and optical systems. However, in many laser fabrication applications, the short Rayleigh range (length before a laser beam diverges) of the Gaussian beam often limits the penetration depth into a sample and imposes additional requirements on the sample.

Compared with Gaussian beam, Bessel beams exhibit unique properties in research and industrial applications. Bessel beam is a "non-diffracting" beam, and its transverse intensity profile does not vary as it propagates, making it the ideal laser beam to perform laser dicing. Since the Bessel beam's waist is narrower than the Gaussian beam, superior cutting results in terms of both resolution and speed can be achieved.

In addition, during a conventional stealth dicing (SD) process, a SD modified layer formed by using the Gaussian beam is relatively thin by one pass. If a thick sample is diced, a plurality of SD modified layer is needed for cutting or dicing. When a sample (e.g. a wafer or a substrate) is thick, many passes (>10) need to be scanned at different depths, the resolution of the dicing results and the dicing speed may be reduced.

Therefore, there is a need for improved systems and methods for dicing samples by a Bessel beam matrix.

SUMMARY

In one aspect, the present disclosure provides a method for dicing a sample by a Bessel beam matrix. The method may comprise: generating a Bessel beam matrix including multiple Bessel beams arranged in a matrix form, according to a predetermined dicing layout of the sample; controlling a focus position of each Bessel beam in the generated Bessel beam matrix; and focusing simultaneously the Bessel beams of the Bessel beam matrix at the respective controlled focus positions within the sample for dicing.

In another aspect, the present disclosure provides in some embodiment a system for dicing a sample by a Bessel beam matrix. The system may comprise a Bessel beam matrix generator for generating a Bessel beam matrix including multiple Bessel beams arranged in a matrix form, according to a predetermined dicing layout of the sample; a controller for controlling a focus position of each Bessel beam in the generated Bessel beam matrix; and a focuser for focusing simultaneously the Bessel beams of the Bessel beam matrix at the respective controlled focus positions within the sample for dicing.

In one aspect, the present disclosure provides in some embodiments a system for dicing a sample by a Bessel beam matrix. The system may comprise a laser source for irradiating a Gaussian beam; a spatial light modulator for generating a Bessel beam matrix including multiple Bessel beams arranged in a matrix form from the irradiated Gaussian beam, according to a predetermined dicing layout of the sample; a splitter for receiving the generated Bessel beam matrix and splitting the Bessel beam matrix into a plurality of Bessel beam sub-matrices; a plurality of electrically tunable lens (ETLs) for controlling a focus position, a focal depth and an intensity distribution of each Bessel beam in the generated Bessel beam matrix; a beam combiner for recombining the plurality Bessel beam sub-matrices with the controlled focus position, focal depth and intensity distribution; and a focuser for focusing simultaneously the Bessel beams of the Bessel beam matrix at the respective controlled focus positions within the sample for dicing.

According to the systems and methods in the present disclosure, the length and aspect ratio of a single or multiple Bessel beams in the matrix can be controlled collectively or independently for the single-depth or multi-depth simultaneous dicing respectively.

The systems and methods in the present disclosure can automatically process samples, e.g. semiconductor wafers and perform various laser dicing/cutting processes with better resolution and higher dicing/cutting speed.

Applications of the systems and methods in the present disclosure include high-speed laser dicing, e.g. stealth dicing (SD); nano-fabrication, e.g. micro-/nano-fluidics devices; jewelry laser internal carving; fabrication of advanced photonic and optical components etc.

BRIEF DESCRIPTION OF THE DRAWING

Exemplary non-limiting embodiments of the present disclosure are described below with reference to the attached drawings. The drawings are illustrative and generally not to an exact scale. Like reference numerals refer to like parts throughout the various views unless otherwise specified.

DETAILED DESCRIPTION

In order to make the objects, the technical solutions and the advantages of the present disclosure clear and complete, the present disclosure will be described hereinafter in a clear and complete manner in conjunction with the drawings and embodiments. Evidently, the following embodiments merely relate to a part of, rather than all of, the embodiments of the present disclosure, and based on these embodiments, a person skilled in the art may, without any creative effort, obtain other embodiments, which also fall within the scope of the present disclosure.

Figure 1:
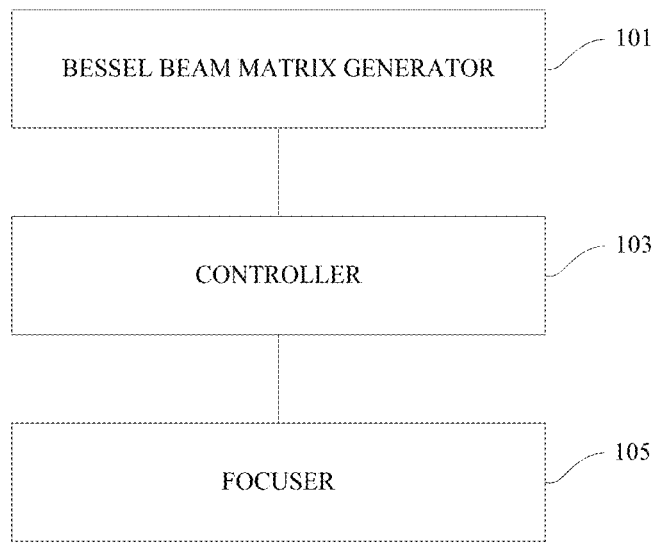
FIG. 1 is a schematic block view illustrating a system for dicing a sample by a Bessel beam matrix according to an embodiment of the present disclosure.

FIG. 1 is a schematic view illustrating a system for dicing a sample by a Bessel beam matrix according to an embodiment of the present disclosure. In the present disclosure, the sample to be diced or proceed may include, but is not limited to a wafer or a substrate of semiconductor, metal or glass.

As shown in FIG. 1, the system 100 for dicing the sample by the Bessel beam matrix may include a beam matrix generator 101, a controller 103 and a focuser 105. In the present disclosure, the Bessel beam matrix refers to a group or an array of Bessel beam in which a plurality of Bessel beams is arranged or configured in a matrix.

The beam matrix generator 101 may generate a Bessel beam matrix including multiple Bessel beams arranged in a matrix form, according to a predetermined dicing layout of the sample. The Bessel beam matrix may be generated from a Gaussian beam. The Gaussian beam may be generated by a nanosecond laser source, a picosecond laser source and a femtosecond laser source. It should be noted that the laser sources are not limited in the present disclosure. Generally, nanosecond or pico-second lasers may be used to introduce defects or material modification; and femto-second laser is used to perform ionization directly. Typical wavelength is 1064 nm (semi-transparent to silicon) or above.

The laser source may be selected depending on the sample or material to be processed in consideration of some key parameters, such as laser power, pulse repetition rate, pulse duration, pulse energy, and peak power.

By way of example and not limitation, the Bessel beam matrix generator may include a spatial light modulator (SLM), e.g. a digital micromirror device (DMD) or a liquid crystal-based SLM (LC-SLM). SLM allows quick and instant beam generation and modulation. Advanced functions, e.g., modifying the beam characteristics at different dicing depth (focal depth) can be realized with an SLM.

The controller 103 of the system 100 may control a focus position (focal point) and a focal depth of each Bessel beam in the Bessel beam matrix generated by the Bessel beam matrix generator 101. The controller 103 may control the focal depth and the focal point of each Bessel beam independently. Alternatively, the controller 103 may control the focal depth and focus position of some of Bessel beams in the matrix collectively or control those of the entire Bessel beams in the matrix collectively. In an embodiment, the controller 103 may also control the intensity distribution of the Bessel beams in the Bessel beam matrix.

The focuser 105 of the system 100 may focus simultaneously each of the Bessel beams of the Bessel beam matrix at the respective controlled focus positions within the sample for dicing.

According to the system for dicing the sample by the Bessel beam matrix disclosed in the present disclosure, the Bessel beam matrix may be generated to perform material modification internally, enhancing the dicing precision and speed.

Figure 2:
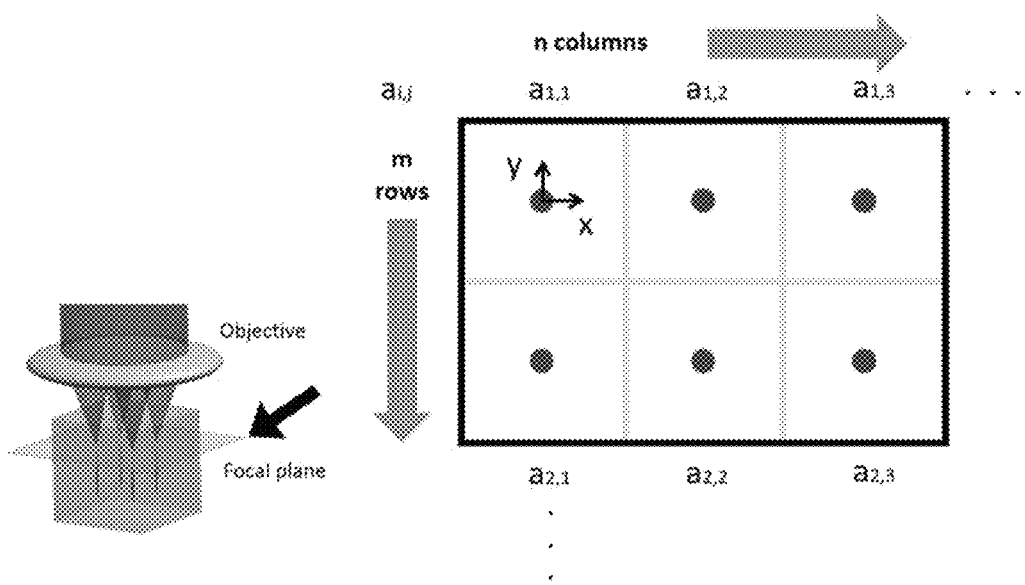
FIG. 2 illustrates a schematic view of an exemplary 2×2 Bessel beam matrix under objective lens (left) and a schematic plane view of an exemplary 2×3 Bessel beam matrix distribution on the focal plane (right) according to the present disclosure.

FIG. 2 illustrates a 2×2 Bessel beam matrix distribution (left) in transparent or semi-transparent materials under an objective lens and a m×n matrix distribution (right) on the focal plane of the beam matrix.

As shown in FIG. 2, an m×n Bessel beam matrix is generated and focused at the focal plane (m and n are positive integers). Accordingly, the matrix contains a total of m×n Bessel beams, wherein m represents the number of rows of Bessel beams and n represents the number of column of Bessel beams. Hereinafter, the column direction is also referred to be x direction, the row direction is referred to be y direction on the focal plane and an axial direction perpendicular to the focal plane is also referred to be z direction.

In an embodiment, the lateral positions along column and row directions of each Bessel beam in the matrix can be individually controlled and moved according to the dicing requirements of the sample.

According to the system disclosed in the present disclosure, the Bessel beam of wavelengths that are semi-transparent or transparent to the sample are used to dice the sample without leaving marks on the surface of the sample. In addition, the direct ionization can be also applied in the system in the present disclosure. When femtosecond lasers are used, the physical mechanism of laser dicing may change from thermal effects to direct ionization, leading to better resolution.

Figure 9A:
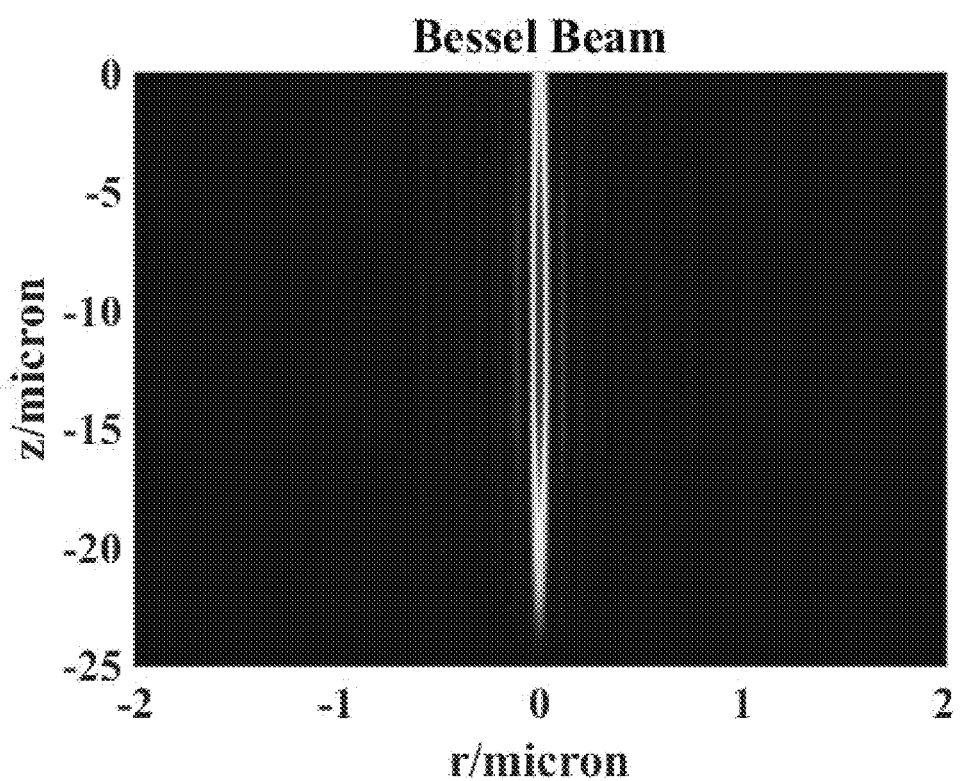
FIGS. 9A and 9B illustrate a comparison of intensity profiles of a Bessel beam and a Gaussian beam, respectively.
Figure 9B:
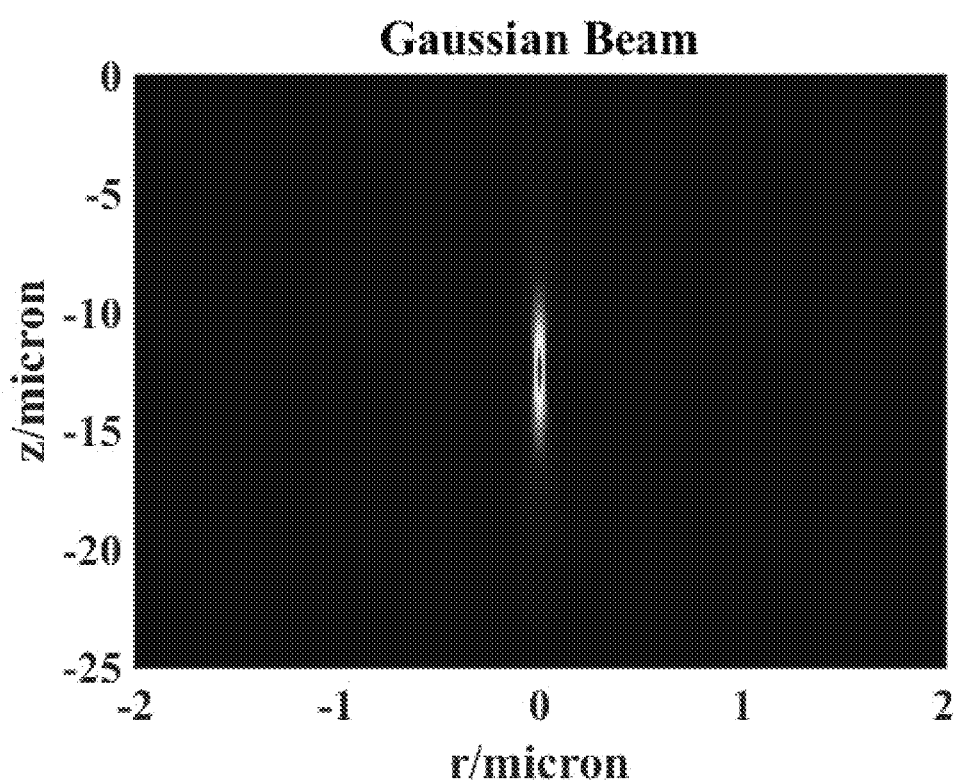

Conventionally, Gaussian beams are generally used in sample processing. However, in many laser fabrication applications, the short Rayleigh range (a length before a laser beam diverges) of the Gaussian beam often limits the penetration depth into a sample and imposes additional requirements on the sample. The comparison of intensity profiles of a Bessel beam and Gaussian beam is shown in FIGS. 9A and 9B. As shown in FIGS. 9A and 9B, it can be seen that Bessel beam's waist is narrower than the Gaussian beam and Bessel beam has a more localized (narrower) lateral intensity profile than Gaussian beam. That is, Bessel beam can be used to enhance the laser fabrication resolution. Bessel beam is a "non-diffracting" beam, where its transverse intensity profile does not vary as it propagates, making it the ideal laser beam to perform laser cutting.

However, according to the system in the present disclosure, the Bessel beam matrix is used to perform laser dicing. In an embodiment, the characteristics, such as length and aspect ratio of a single Bessel beam in the matrix may be controlled for a single-depth cutting. In another embodiment, the characteristics of all the Bessel beams in the matrix may be controlled collectively. Therefore, the superior cutting results in terms of both resolution and speed can be achieved.

The Bessel beam matrix generator 101 may generate the Bessel beam matrix from the Gaussian beam by coding with patterns, i.e., a sub-hologram method, which will be described later. The Gaussian beam may be femto-second, pico-second and nanosecond lasers.

Figure 3A:
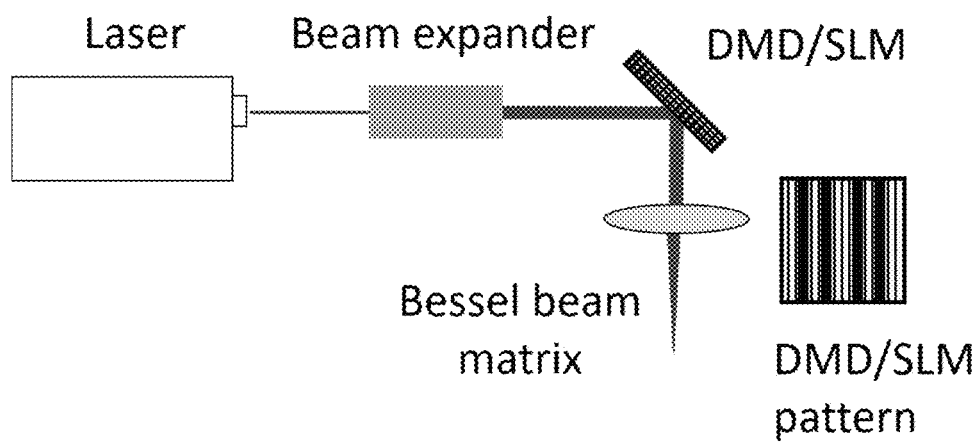
FIG. 3A illustrates an exemplary design of a Bessel beam matrix generator for generating nanosecond or picosecond Bessel beams according to an embodiment of the present disclosure.
Figure 3B:
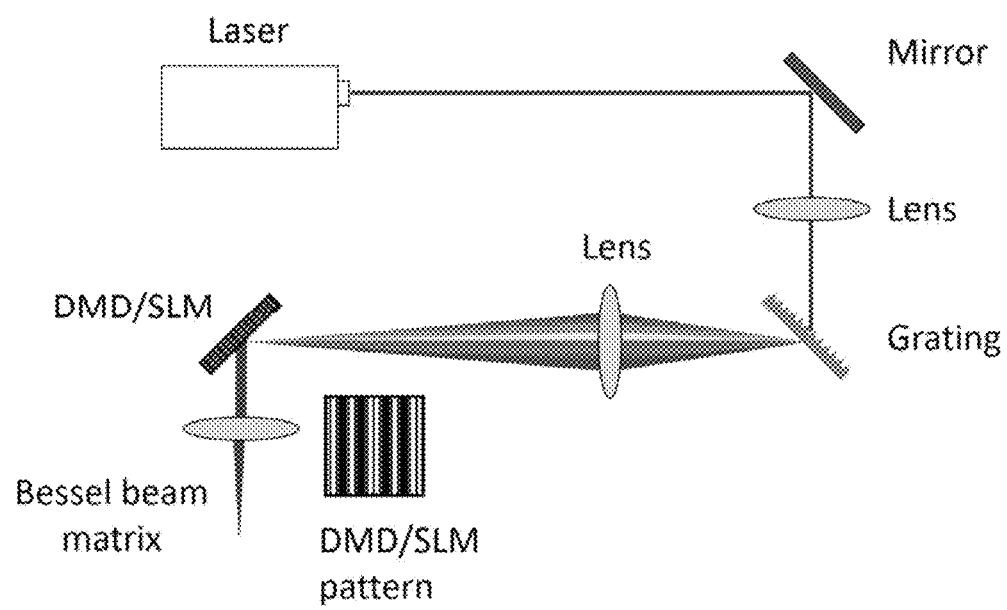
FIG. 3B illustrates an exemplary design of a matrix generator for generating femto-seconds Bessel beams according to an embodiment of the present disclosure.

FIG. 3A illustrates an exemplary optical configuration of the Bessel beam matrix generator for generating nanosecond or pico-second Bessel beams using a SLM or DMD, and FIG. 3B illustrates an exemplary optical configuration of the Bessel beam matrix generator for generating femto-second Bessel beams using a SLM or DMD. It is noted that although the SLM/DMD is shown as the main device for generating the Bessel beam matrix, the Bessel beam matrix generator is not limited to the SLM/DMD.

By changing the pattern on the SLM/DMD, different Bessel beam matrix can be generated. The parameters (e.g. length, power, intensity distribution, and location) of each Bessel beam can be controlled individually.

As shown in FIG. 3A, a nanosecond or pico-second laser is generated by the laser source and the Bessel beam matrix generator may include a spatial light modulator (SLM), e.g. a digital micromirror device (DMD) or a liquid crystal-based SLM (LC-SLM) and a transmission grating.

By using SLM/DMD for beam generating, the characteristics (i.e., power distribution at different depths, length, size, and aspect ratio etc.) of the Bessel beam matrix can be adjusted for optimal processing results.

As shown in FIG. 3B, femto-second lasers are generated from the laser and the Bessel beam matrix generator may include a spatial light modulator (SLM), e.g. a digital micromirror device (DMD) or a liquid crystal-based SLM (LC-SLM). Different from the optical design in FIG. 3A, a transmission grating is included to compensate the angular dispersion introduced to the laser by the DMD. The transmission grating together with the lens may compensate the dispersion of the femto-second laser introduced by the SLM and then the laser beam is projected to the SLM coded with patterns (e.g. binary hologram), so that the Bessel beam matrix may be generated from the Gaussian beam according to the predetermined dicing layout of the sample.

The Bessel beam matrix generator 101 may generate the Bessel beam matrix by a sub-hologram method.

Specifically, the generator 101 may divide a mask into multiple regions, wherein a number of the regions is the same as the number of dicing portions in the dicing layout. In an embodiment, the generator divides the mask on the generator into m×n regions to generate an m×n Bessel beam matrix. The generator may further form a sub-pattern in each of the multiple regions, wherein pattern information of each sub-pattern is associated with the focus position and the focal depth of each Bessel beam; and generate the respective Bessel beams according to the formed sub-patterns to generate the Bessel beam matrix.

Figure 4A:
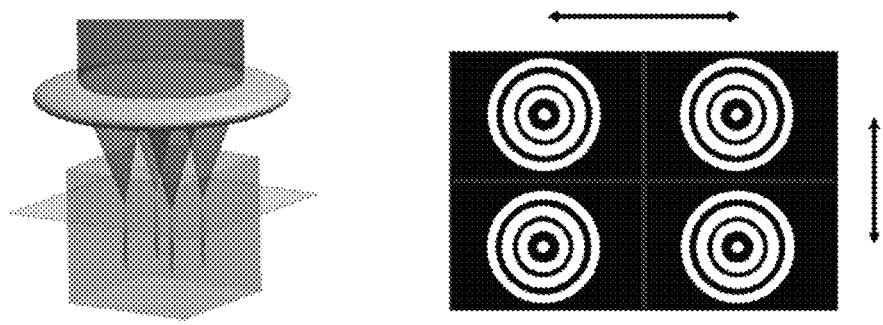
FIG. 4A illustrates an exemplary Bessel beam matrix with identical Bessel beams and the corresponding pattern according to another embodiment of the present disclosure.
Figure 4B:
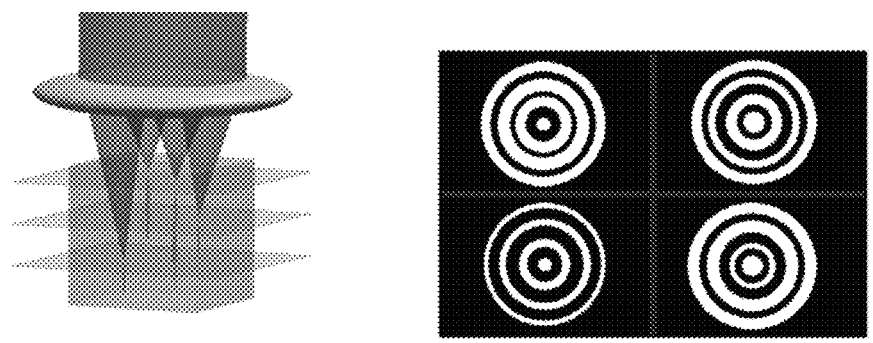
FIG. 4B illustrates an exemplary Bessel beam matrix with different Bessel beams and the corresponding pattern according to another embodiment of the present disclosure.

FIGS. 4A and 4B illustrate exemplary patterns on the matrix generator and the corresponding patterns according to an embodiment. In FIG. 4A, a 2×2 Bessel beam matrix with 4 identical Bessel beams at the same focal depth is shown at the left, where the mask on the matrix generator (e.g., SLM/DMD) is divided into 4 (i.e., 2×2) regions; and the corresponding 22 sub-patterns for generating the individual Bessel beam in the matrix are shown at the right. The lateral positions of the Bessel beams at the focal plane depend on the position of the sub-patterns on the matrix generator and the projection optical configuration.

In FIG. 4B, a 2×2 Bessel beam matrix with varying beam characters is shown at the left; and the corresponding 2×2 sub-patterns on the matrix generator (e.g., SLM/DMD) are shown at the right. As shown in FIG. 4B, the individual Bessel beams in the matrix can be controlled by adjusting the sub-patterns on the matrix generator (e.g., SLM/DMD). The focal depth, length, power and energy distribution along axial direction of each Bessel beam can be controlled by the sub-pattern.

Alternatively, the generator 101 may generate the Bessel beam matrix by a superposition method.

Specifically, the generator 101 may form a phase mask according to the dicing layout of the sample; perform a liner phase modulation and a quadratic phase modulation on the phase mask; superpose the modulated phase mask; and modulate phases of the Bessel beams collectively according to the superposed phase mask to generate the Bessel beam matrix.

In an embodiment, a Bessel beam matrix is generated by performing superposition of individual modulation patterns as below:

$$T(u, v) = t(u, v) * \frac{1}{n} \sum_{k=1}^{n} \varphi_k(\Delta x_k, \Delta y_k) * \varphi(\Delta z_k)$$

where $T(u,v)$ is the transfer function applied to the SLM, n is the total number of beams in the matrix, $\varphi_k(\Delta x_k, \Delta y_k)$ are the linear phase modulation for plane shift, and $\varphi(\Delta z_k)$ is the quadratic phase modulation for depth shift.

The energy distribution for individual Bessel beams in the matrix may be independently modulated by varying the proportions of the phase modulations in the equation below:

$$T(u, v) = t(u, v) * \frac{1}{\sum_{k=1}^{n} c_k} \sum_{k=1}^{n} c_k \varphi(\Delta x, \Delta y) * \varphi(\Delta z) \text{ where } \left(\frac{c_k}{\sum_{k=1}^{n} c_k}\right)^2$$

gives the fraction of the total power by the $k_{th}$ beam in the matrix.

Figure 5:
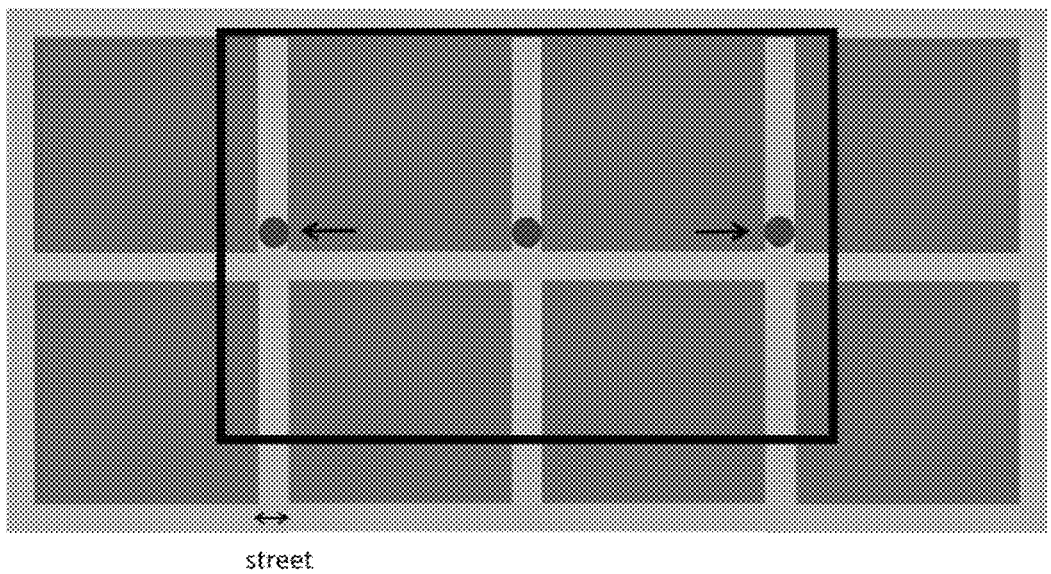
FIG. 5 illustrates a 1×3 Bessel beam matrix is used for dicing the sample along the row direction according to an embodiment of the present disclosure.

The lateral position of each Bessel beam at the focal plane may be controlled independently to dice samples of different sizes. FIG. 5 illustrates a 1×3 Bessel beam matrix is used for dicing the sample along the row direction. In FIG. 5, the sample is labeled in black and the desired paths (or street) in the layout are labeled in light black, the black box represents the work volume of the Bessel beam matrix, and the dots represent the focal points of three Bessel beams. During a dicing process, the three Bessel beams may be adjusted to align with the cutting streets, and subsequently the sample is scanned vertically.

In an embodiment, the controller 103 may split the Bessel beam matrix into a plurality of Bessel beam sub-matrices, each Bessel beam sub-matrix passing through an ETL; modify the focus positions, focal depths and intensity distributions of all the Bessel beams in the respective sub-matrix collectively; and recombine the controlled a plurality of sub-matrices into a Bessel beam multi-matrix to be applied on the sample. In an implementation, the focal depths (i.e., the focal position in Z direction) of sub-matrices are only controlled by ETL Different pattern on matrix-generator (e.g. SLM) control the focal position in X and Y directions, intensity distribution, Bessel beam length and number of Bessel beam.

In an embodiment, the controller 103 may control the focus position and focal depth of all the Bessel beams in the entire Bessel beam matrix collectively by an electrically tunable lens (ETL).

Figure 6A:
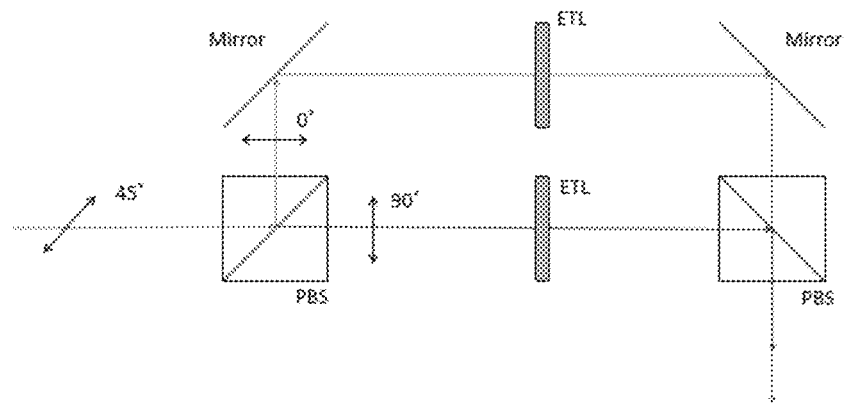
FIG. 6A illustrates the Bessel beam matrix is split into two sub-matrices according to an embodiment of the present disclosure.
Figure 6B:
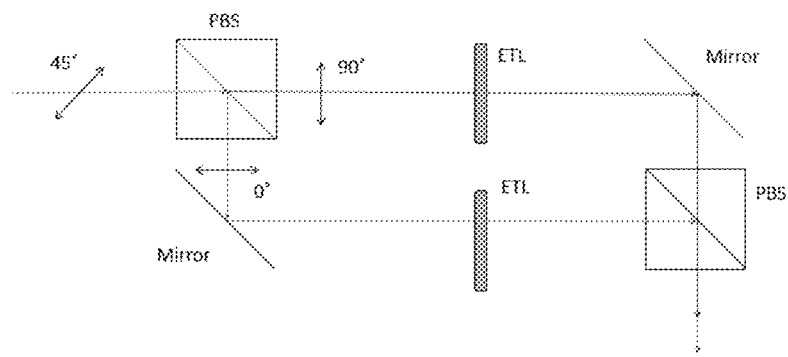
FIG. 6B illustrates the Bessel beam matrix is split into two sub-matrices according to another embodiment of the present disclosure.

FIGS. 6A and 6B illustrate the Bessel beam matrix is split into two sub-matrices as an example. The beam matrix configuration is selected due to the ultra-long intensity profile (>100 μm) of the Bessel beam. It should be noted that, although two split sub-matrices are shown, the present disclosure is not limited to this and a plurality of sub-matrices may be split from one Bessel beam matrix to collectively control the focal depth, focus position and the intensity distribution of all the Bessel beams in the matrix.

As shown in FIGS. 6A and 6B, a 45 degree polarized beam is split into 0 degree and 90 degree polarized beams by the polarizing beam splitter (PBS). Each beam passes through the respective ETLs for focal depth control. After ETLs, the two Bessel beams with different focal depths are combined by the DM and PBS.

As shown, each of the two sub-matrices passes through an ETL and each ETL controls the position of each (m×n) Bessel beam matrix. A Bessel beam double-matrix may be generated after recombining the two sub-matrices, i.e., an m×n×2 matrix. The focal depths of each matrix may be controlled by the ETL.

ETLs are chosen due to their ease of operation and high scanning speed (100 Hz-1 kHz). The controller may also one of a fast axial scanner, a piezoelectric scanner, a wavefront control device, e.g. a DMD or a LC-SLM. It should be noted that the controller is not limited to those described in the present disclosure. After focus control by the controller, the Bessel beams are directed to two beam combiner/beam splitter respectively, directed to a turret with objective lenses (e.g. distance objectives) and then guided on the sample (e.g. a wafer) on a XYZ stage, to dice the sample. In an implementation, the beam combiner/beam splitter may be a DM (Dichroic Mirror).

In another embodiment, the controller 103 may control the focus position, focal depth and intensity distribution of individual Bessel beam in the matrix independently. The controller 103 may modify a lateral shift distance of each of the Bessel beams on a focal plane of the Bessel beam matrix and modify an axial shift distance of each of the Bessel beams along an axial direction perpendicular to the focal plane.

In an embodiment, an ideal non-diffracting Bessel beam may be mathematically described as below:

$$I(x,y,z \geq 0) = I(x,y,0)$$

where I(x,y,z) denotes the intensity distribution of the beam and z denote the propagation distance.

In practice, the total energy is limited, so a finite-aperture approximation of the non-diffracting Bessel beam with a transverse intensity distribution proportional to the function where z=0 and $I(x,y,0)=|U(x,y)|^2$. The term $|U(x,y)|^2$ can be generated by a computer-generated hologram (programmed to an SLM or DMD in one embodiment). Accordingly, the transmission function may be described as $$t(\rho, \varphi) = \begin{cases} A(\varphi)\exp\left(-\frac{i2\pi\rho}{\rho_0}\right), & \rho < D \\ 0, & \rho > D \end{cases}$$

where (ρ, φ) are coordinates in the polar coordinate system in the z=0 plane, $\rho_0$ is a constant, and A(φ) is a complex function.

$$\exp\left(-\frac{i2\pi\rho}{\rho_0}\right)$$

can produce a conical wave, which defines the characteristics of the zero-order Bessel beam. Using the Fresnel diffraction integral in cylindrical coordinates, and expanding A(φ) into a Fourier series, i.e.

$$A(\varphi) = \sum_{n=-\infty}^{\infty} \alpha_n \exp(in\varphi),$$

the proportionality for the optical intensity in the observation plane along the optical axis is represented as below:

$$I(\rho, \varphi, z) \propto z \left| \sum_{n=-\infty}^{\infty} 2\pi(-i)^n a_n \exp(in\varphi) J_n\left(\frac{2\pi k\rho}{\gamma}\right) \right|^2$$

where k=2π/λ is the wave vector, $\gamma=\rho_0 k$ is a constant defined. Then, the following equation is derived:

$$z_{max} = \frac{\gamma D}{2\pi} = \frac{\rho_0 D}{\lambda}$$

Accordingly, the diffraction-free propagation distance is modulated by changing the aperture size and the maximum phase at the boundary. The transverse energy distribution can also be controlled. A(φ)=exp(inφ) can produce an infinite cylindrical image surface, centered at the z axis with a radius of $$r = \frac{n\rho_0}{2\pi}$$

Reviewing the Fourier transform relationship below, it can be concluded that adding linear phase in the Fourier plane can cause a shift of the Bessel beam in the lateral direction, i.e., x or y directions.

$$\exp[j\pi(ax+by)] <-FT-> \delta\left(f_x - \frac{a}{2}, f_y - \frac{b}{2}\right)$$

Assuming the SLM plane is denoted as the plane (u,v) and the focal plane is denoted as the plane (x,y), if one adds linear phase to the SLM as follows $$\varphi(u) = \sin\left(2\pi \frac{u}{d_u}\right)$$

$$\varphi(v) = \sin\left(2\pi \frac{v}{d_v}\right)$$

where $d_u$, $d_v$ are the periods of the grating phase added to the SLM or DMD; and according to the grating equation, the $1^{st}$ order of the incident beam is diffracted by an angle θ

$$\theta_x = \frac{\lambda}{d_u}$$

$$\theta_x = \frac{\lambda}{d_v}$$

where λ is the wavelength, then the corresponding lateral shift of the Bessel beam on the focal plane will be $$\Delta x = f_{obj} \cdot \theta_x = f_{obj} \frac{\lambda}{d_u}$$

$$\Delta y = f_{obj} \cdot \theta_y = f_{obj} \frac{\lambda}{d_v}$$

The axial position of a Bessel beam can be controlled by adding quadratic phase in the Fourier plane to vary the divergence of the incident wave, i.e., $$\varphi(z) = \frac{k}{2f}(u^2 + v^2) \qquad \text{Eq. (a)}$$

where φ(z) represents a lens of focal length f. Then, the depth can be modulated by $$\Delta z = \frac{f * f_{obj}}{f} - f_{obj} \qquad \text{Eq. (b)}$$

where $f_{obj}$ is the focal length of the objective lens the depth, and f is the equivalent focal length of the projection optical configuration. The projection optical configuration for example includes lens and grating in the system for dicing.

By applying the steps described above, any Bessel beam in the matrix may be shifted in all three directions arbitrarily. Multiple beams can be simultaneously controlled by superposing additional holograms.

Figure 7A:
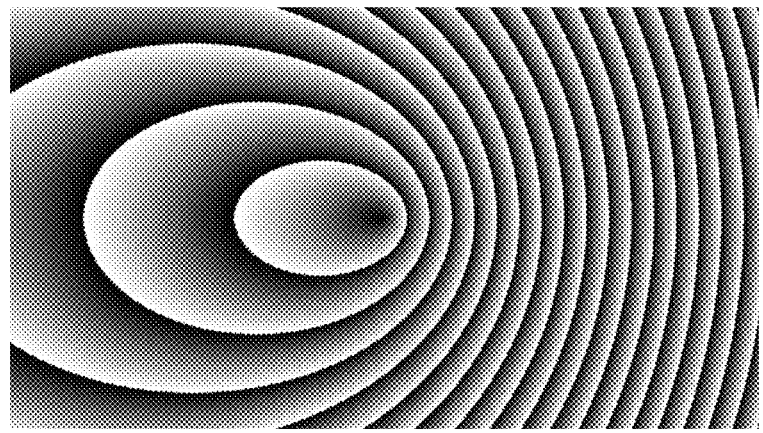
FIGS. 7A-7C illustrate exemplary patterns according to embodiments of the present disclosure.
Figure 7B:
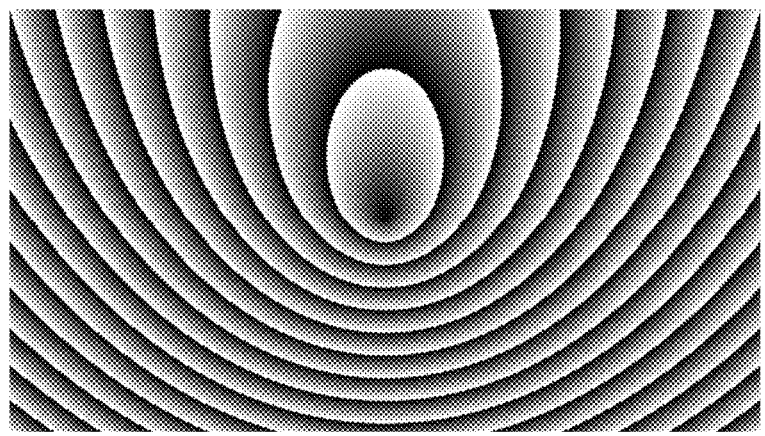
Figure 7C:
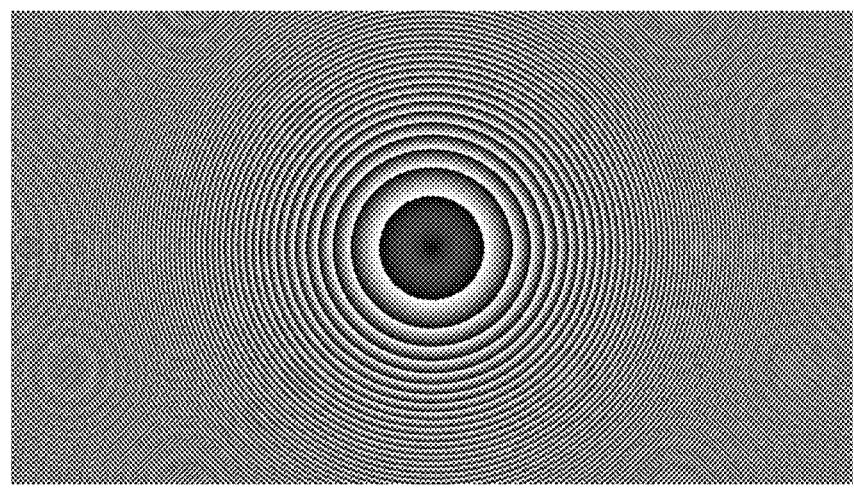

FIGS. 7A and 7B illustrate exemplary patterns for shifting the Bessel beam in the lateral (x and y) directions respectively. FIG. 7C presents exemplary pattern for shifting the Bessel beam in axial (z) direction.

In an embodiment, the sample may be diced by inducing defects or modifying the material of the sample. When the Bessel beam passes through the material (e.g. silicon) of the sample, the material absorbs energy and thus high power intensity is required to modify the deeper region of the material. In the present disclosure, the intensity distribution along the Bessel beams in the matrix can be modified independently or collectively and optimized for processing material. For example, the Bessel beam with increasing power intensity along the cutting depth is used in cutting silicon wafer.

Figure 8:
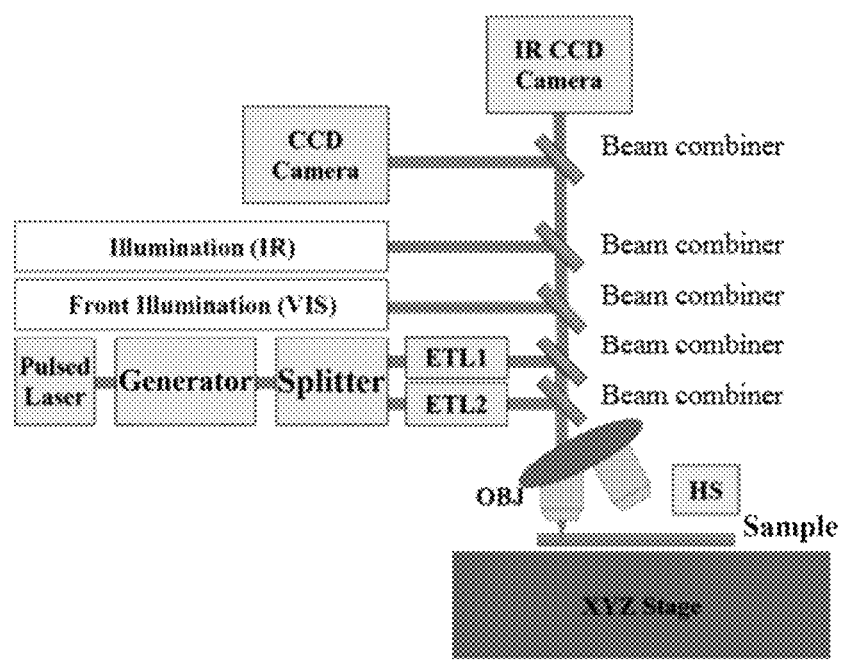
FIG. 8 illustrates an exemplary optical configuration of the system for dicing the sample by the Bessel beam matrix according to an embodiment of the present disclosure.

FIG. 8 illustrates an exemplary optical configuration of the system for dicing the sample by the Bessel beam matrix according to an embodiment of the present disclosure. The configuration may be selected due to the ultra-long intensity profile (>100 μm) of the Bessel beam.

As shown in FIG. 8, the system may include a pulsed laser source for generating the Gaussian beam. The Gaussian beam generated from the pulsed laser source may be directed to the Bessel beam matrix generator and generated into a Bessel beam matrix, according to the to-be-diced layout of the sample. Then, the generated beam matrix may be directed to a splitter and be split into two Bessel beam sub-matrices. In this embodiment, the Bessel beam matrix generated by the generator is split into two sub-matrices and controlled by two ETLs. However, it should be noted that the present disclosure is not limited to two sub-matrices or two ETLs. ETLs are chosen due to their ease of operation and high scanning speed (100 Hz-1 kHz).

The focal depths of each of the two Bessel beam sub-matrices are only controlled by an electrically tunable lens (ETL1 or ETL2). Then, the two Bessel beam sub-matrices are recombined by the beam combiner. The recombined Bessel beam matrix is then guided and focused into the sample (e.g. a wafer) on a XYZ stage, under the objective lens (OBJ) to dice along the lateral directions (column or row directions) and along the axial direction, so that the sample is diced in accordance with the predetermined layout.

In an embodiment, the system may include a detector (not shown), which may detect simultaneously a surface profile of the sample and a cutting point inside the sample. In an embodiment, the surface profile of the sample may be detected or monitored by using visible light and the cutting point inside the sample may be detected by using an infrared (IR) light source paired with an IR camera. The simultaneous detecting of both the surface profile of the sample and the cutting point inside the sample allows optimizing the laser-material interaction processes, thereby fine-tuning the laser properties to minimize width of the dicing paths and maximize throughput. The controller and the detector are coupled with each other to communicate information. In an implementation, the detector using visible light may be a height sensor.

As shown in FIG. 8, the system further includes a height sensor (HS). The HS may read the surface profile of the sample and send signals to the ETL to control the focal points in real time, thereby ensuring the laser scan lines remain at the same depth inside the sample and ensuring the distance between the objective lens and the sample being constant during the laser scanning and the sample position processes. The height sensor is communicated with the controller and the detector. The height sensor is configured to receive profile information of the sample from the detector and transmitting the information to the controller to keep the Bessel beams remaining at the same depth insider the sample.

Note that the focal depth control is critical due to the warpage issue in different samples. The focal depth control can thus compensate the geometric errors in the sample during the laser scanning processes (typically 500-1000 mm/s) and ensure the laser cut always remain in the target depth of the sample, leading to optimal results. The spatial distribution of Bessel beam matrix can be adjusted to compensate negative effects, e.g., wafer warping or stage positioning error, in order to optimize the dicing performance.

In the above, the systems for dicing the sample with Bessel beam matrices have been disclosed. Hereinafter, methods for dicing a sample by Bessel beam matrices will be described. It is to be understood and appreciated that the various embodiments are not limited by the acts illustrated and/or by the order of acts.

Figure 10:
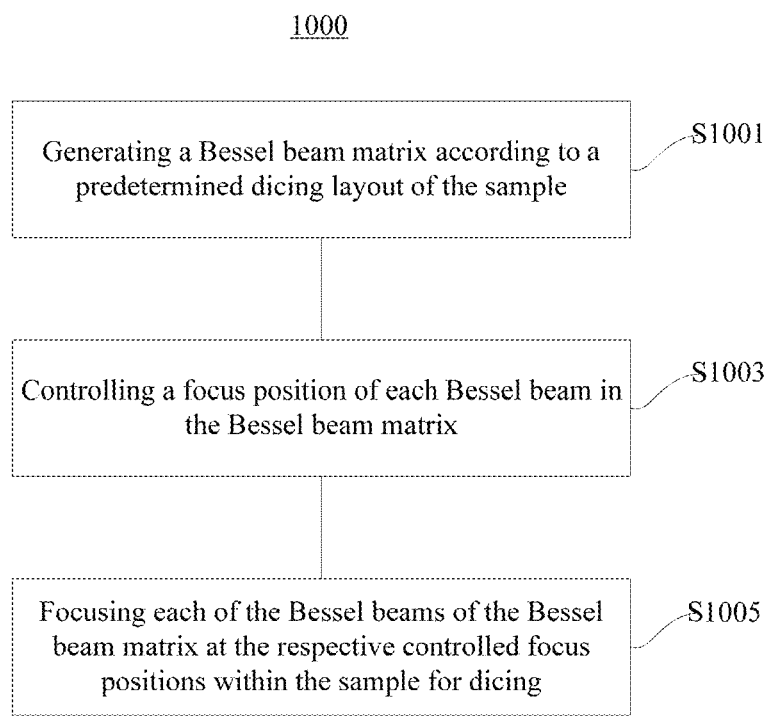
FIG. 10 illustrates a method for dicing a sample by a Bessel beam matrix according to an embodiment of the present disclosure.

FIG. 10 is a schematic view illustrating a method for dicing a sample by a Bessel beam matrix according to an embodiment of the present disclosure. In the method 1000, a Bessel beam matrix including multiple Bessel beams arranged in a matrix form is generated according to a predetermined dicing layout of the sample at step S1001. Then, a focus position and a focal depth of each Bessel beam in the generated Bessel beam matrix may be controlled at step S1003. At step S1005, each of the Bessel beams of the Bessel beam matrix may be focused at the respective controlled focus positions within the sample for dicing.

In an embodiment, the step of generating may include dividing a mask into multiple regions, wherein a number of the regions is the same as the number of dicing portions in the dicing layout, forming a sub-pattern in each of the multiple regions, wherein pattern information of each sub-pattern is associated with the focus position and the focal depth of each Bessel beam; and generating the respective Bessel beams according to the formed sub-patterns to generate the Bessel beam matrix.

In an embodiment, the step of generating may include forming a phase mask according to the dicing layout of the sample; performing a liner phase modulation and a quadratic phase modulation on the phase mask; superposing of the modulated phase mask; and modulating phase of the Bessel beams collectively according to the superposed phase mask to generate the Bessel beam matrix.

In an embodiment, a focal depth and an intensity distribution may be controlled along the individual Bessel beams in the Bessel beam matrix independently.

In an embodiment, the step of controlling may include splitting the Bessel beam matrix into a plurality of Bessel beam sub-matrices, each Bessel beam sub-matrix passing through an ETL; modifying the focus positions, focal depths and intensity distributions of all the Bessel beams in the respective sub-matrix collectively; and recombining the controlled a plurality of sub-matrices into a Bessel beam multi-matrix to be applied on the sample. In another embodiment, the step of controlling may include modifying a lateral shift distance of each of the Bessel beams on a focal plane of the Bessel beam matrix; and modifying an axial shift distance of each of the Bessel beams along an axial direction perpendicular to the focal plane. The focal depths of the Bessel beams in the respective sub-matrix may be modified only by the ETL Hereinafter, some experiment results obtained according to the systems and methods in the present disclosure are demonstrated. The laser dicing system can automatically process semiconductor wafers and perform various laser cutting processes with better resolution and with equal or higher cutting speed compared with state-of-the-art commercial systems.

Figure 11:
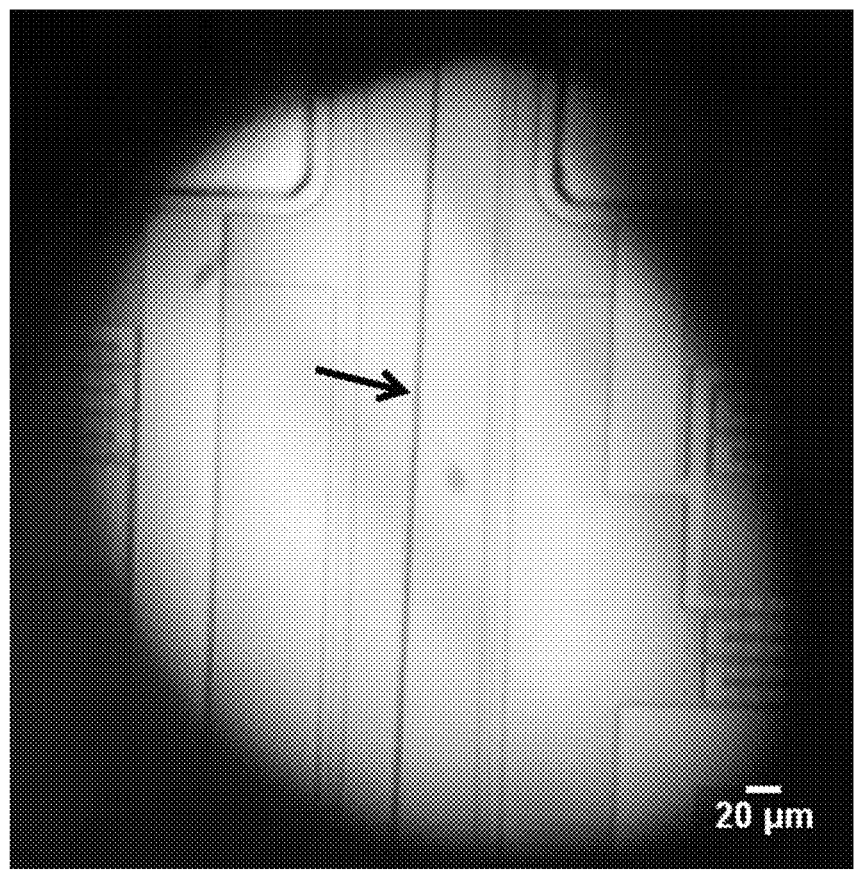
FIG. 11 illustrates experimental results by the Bessel beam matrix according to the present disclosure.

FIG. 11 illustrates exemplary experiment results on silicon wafers and MEMS samples based on Bessel beam matrix according the present disclosure and by a Gaussian beam. The results indicate that the Bessel beam system can dice at a much faster speed with better resolution (kerf<5 micron). The state of the art commercial systems have a kerf width of 10-20 microns.

As shown in FIG. 11, a two microns wide kerf is diced or grooved by femtosecond laser, where the scale bar is 20 um.

Figure 12:
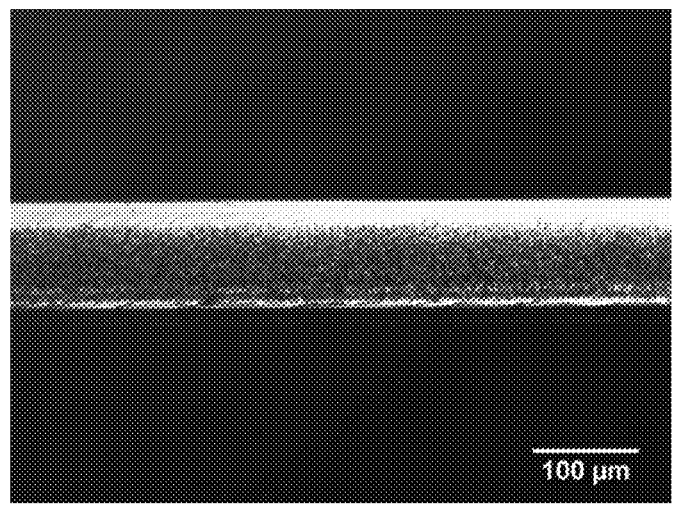
FIG. 12 illustrates a cross-section of an exemplary experiment result performed in a single pass by the method according to an embodiment of the present disclosure.

FIG. 12 illustrates a cross-section of stealth dicing (SD) result performed in a single pass according to an embodiment of the present disclosure, where the scale bar is 100 um. As shown in FIG. 12, the SD modified layer is formed with a single pass on a thin wafer (100 microns thick).

Figure 13:
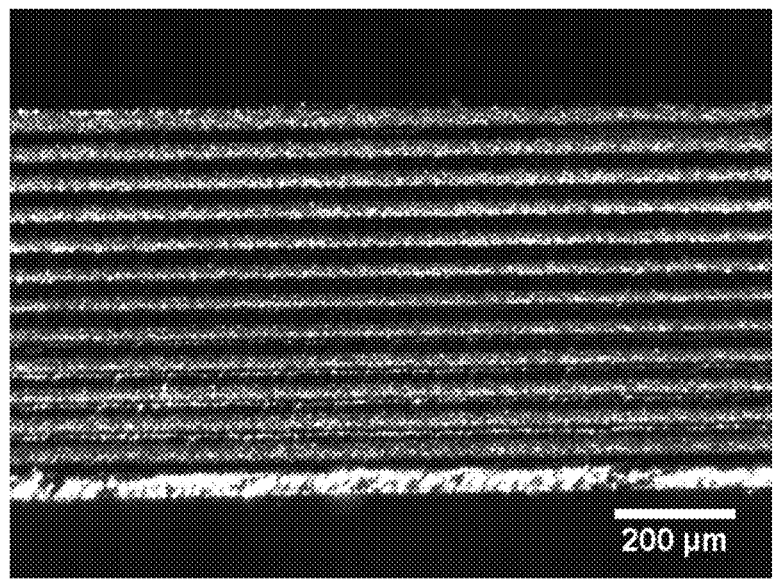
FIG. 13 illustrates a cross-section of an exemplary experiment result performed in a multi-pass by the method according to an embodiment of the present disclosure.

FIG. 13 illustrates a cross-section of stealth dicing (SD) result performed in multiple passes by the method according to an embodiment of the present disclosure. As shown in FIG. 13, multi SD modified layer are formed by multiple passes on a thick wafer (650 microns thick).

Figure 14:
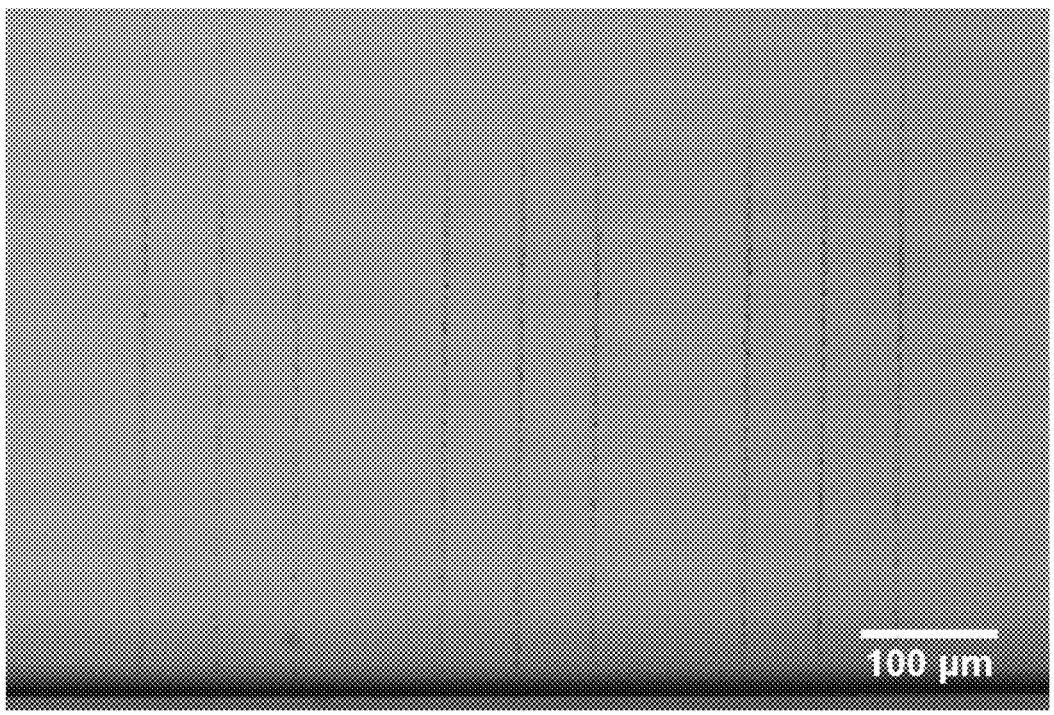
FIG. 14 illustrates an exemplary experiment result in silica glass by the method according to an embodiment of the present disclosure.

FIG. 14 illustrates an exemplary experiment result in silica glass by the method according to an embodiment of the present disclosure.

In this particular example, the length of the Bessel beam focus region is ~500 microns; and the width of the kerfs are 3 microns, ensuring minimal kerf width. This also confirms that even for thick wafers, the dicing can be completed with a single pass.

The above are merely optional embodiments of the present disclosure. A person skilled in the art may make modifications and improvements to those embodiments without departing from the principle of the present disclosure, and these modifications and improvements shall also fall within the scope of the present disclosure.

What is claimed is:

1. A system for dicing a sample by a Bessel beam matrix, comprising:
a Bessel beam matrix generator for generating a Bessel beam matrix including multiple Bessel beams arranged in a matrix form, according to a predetermined dicing layout of the sample;
a controller for controlling a focus position of each Bessel beam in the generated Bessel beam matrix; and
a focuser for focusing simultaneously the Bessel beams of the Bessel beam matrix at the respective controlled focus positions within the sample for dicing,
wherein the focuser is further configured to:
shift one or more of the Bessel beams in the Bessel beam matrix along a column direction and a row direction through the sample to dice the sample; and
shift independently one or more of the Bessel beams in the Bessel beam matrix along an axial direction through the sample to dice the sample.

2. The system according to claim 1, wherein the generator is further configured to:
divide a mask on the generator into multiple regions with the same number as the number of dicing portions in the dicing layout; and
form a sub-pattern in each of the multiple regions, wherein pattern information of each sub-pattern is associated with the focus position and the focal depth of each Bessel beam; and
generate the respective Bessel beams according to the formed sub-patterns to generate the Bessel beam matrix.

3. The system according to claim 1, wherein the generator is further configured to:
form a phase mask according to the dicing layout of the sample;
perform a liner phase modulation and a quadratic phase modulation on the phase mask;
superpose of the modulated phase mask; and
modulate phase of the Bessel beams according to the superposed phase mask to generate the Bessel beam matrix.

4. The system according to claim 1, the generator is selected from a spatial light modulator (SLM), a digital micromirror device (DMD) or a liquid crystal-based SLM (LC-SLM).

5. The system according to 1, wherein the controller is further configured to control a focal depth and an intensity distribution along the individual Bessel beams in the Bessel beam matrix independently.

6. The system according to claim 1, wherein the system further comprises ETLs and the controller is further configured to:
split the Bessel beam matrix into a plurality of Bessel beam sub-matrices, each Bessel beam sub-matrix passing through an ETL;

modify the focus positions, focal depths and intensity distributions of all the Bessel beams in the respective sub-matrix collectively; and recombine the controlled a plurality of sub-matrices into a Bessel beam multi-matrix to be applied on the sample.

7. The system according to claim 1, wherein the controller is further configured to modify a lateral shift distance of each of the Bessel beams on a focal plane of the Bessel beam matrix; and modify an axial shift distance of each of the Bessel beams along an axial direction perpendicular to the focal plane.

8. The system according to claim 6, wherein the focal depths of the Bessel beams in the respective sub-matrix are modified only by the respective ETL.

9. The system according to claim 1, further comprising:
a height sensor for detecting simultaneously surface profile information of the sample and position information of the Bessel beam into the sample, and transmitting the detected surface profile information to the controller for controlling.

10. A system for dicing a sample by a Bessel beam matrix, comprising:
a laser source for irradiating a Gaussian beam;
a spatial light modulator for generating a Bessel beam matrix including multiple Bessel beams arranged in a matrix form from the irradiated Gaussian beam, according to a predetermined dicing layout of the sample;

a beam splitter for receiving the generated Bessel beam matrix and splitting the Bessel beam matrix into a plurality of Bessel beam sub-matrices;

a beam combiner for recombining the plurality Bessel beam sub-matrices; and a focuser for focusing simultaneously the Bessel beams of the Bessel beam matrix at the respective controlled focus positions within the sample for dicing, wherein the system further comprises a plurality of electrically tunable lens (ETL) for controlling a focal depth of each Bessel beam in the generated Bessel beam matrix, and wherein the focus positions in a focal plane and an intensity distribution of each Bessel beam are controlled by the spatial light modulator, so that the Bessel beams with the controlled focus positions, focal depth and intensity distribution are focused by the focuser for dicing the sample.

11. The system according to claim 10, wherein the spatial light modulator is coded with sub-patterns, wherein the number of the sub-patterns is the same as the number of dicing portions in the dicing layout, and the spatial light modulator is further configured to form a sub-pattern in each of the multiple regions and generate the respective Bessel beams, according to the formed sub-patterns to generate the Bessel beam matrix, wherein pattern information of each sub-pattern is associated with the focus position and the focal depth of each Bessel beam.

* * * * *